(12) United States Patent
Setty et al.

(10) Patent No.: US 6,917,796 B2
(45) Date of Patent: Jul. 12, 2005

(54) TRIPLE BALANCED MIXER

(75) Inventors: Radha Setty, Staten Island, NY (US);
Daxiong Ji, Brooklyn, NY (US)

(73) Assignee: Scientific Components, Brooklyn, NY (US)

( * ) Notice: Subject to any disclaimer, the term of this patent is extended or adjusted under 35 U.S.C. 154(b) by 452 days.

(21) Appl. No.: 10/260,043

(22) Filed: Sep. 30, 2002

(65) Prior Publication Data

US 2003/0068996 A1 Apr. 10, 2003

Related U.S. Application Data

(60) Provisional application No. 60/326,819, filed on Oct. 4, 2001.

(51) Int. Cl.[7] .................................................. H04B 1/26
(52) U.S. Cl. ....................... 455/326; 455/293; 455/333
(58) Field of Search ............................... 455/326, 323, 455/324, 333, 334, 338, 311, 293, 280, 130, 325; 327/206, 207, 210, 220, 272, 329

(56) References Cited

U.S. PATENT DOCUMENTS

| | | | | |
|---|---|---|---|---|
| 6,587,699 B2 | * | 7/2003 | Olsen et al. | ................. 342/359 |
| 6,611,696 B2 | * | 8/2003 | Chedester et al. | ........... 342/359 |
| 6,665,546 B2 | * | 12/2003 | Slaughter et al. | ......... 455/562.1 |
| 6,714,800 B2 | * | 3/2004 | Johnson et al. | ............. 455/561 |

* cited by examiner

*Primary Examiner*—Edward R Urban
*Assistant Examiner*—Thuan Nguyen
(74) *Attorney, Agent, or Firm*—Kevin Redmond

(57) ABSTRACT

A triple balanced mixer has a compact size and is readily assembled. The triple balanced mixer has a planar substrate that is formed from several layers of low temperature co-fired ceramic. The substrate has a top layer, a bottom layer and inner layers. Vias extend through the substrate. A local oscillator balun and RF balun are located on the inner layers. An intermediate frequency balun is mounted to the top layer. Diode rings are mounted on the top layer. The diode rings are electrically connected to the local oscillator balun, the RF balun and the intermediate frequency balun through the vias.

23 Claims, 8 Drawing Sheets

TRIPLE BALANCED MIXER

This application claims the benefit of provisional appl. No. 60/326,819, filed Oct. 04, 2001.

BACKGROUND OF THE INVENTION

1. Field of the Invention

This invention relates to mixers in general and more particularly to a triple balanced mixer that provides high isolation in a small package size.

2. Description of the Prior Art

A mixer circuit converts a radio frequency (RF) signal to an intermediate frequency (IF) signal which is the difference of the RF and a local oscillator (LO) signal. The IF frequency is obtained by multiplying the RF signal with the local oscillator (LO) signal. The difference or IF frequency is a result of the non-linearity of the mixer. Along with the IF frequency, the mixer typically generates inter-modulation products due to the non-linearity response.

Isolation is a measure of the circuit balance within the mixer. When the isolation is high, the amount of leakage or feed through between the mixer ports will be very small. Typically, isolation decreases as frequency increases due to the unbalance in the mixer circuit. Isolation can be measured as LO-RF isolation which is the amount the LO drive level is attenuated when it is measured at the RF port. LO to IF isolation is the amount the LO drive level is attenuated when it is measured at the IF port.

Mixers are typically designed with one of three topologies: single ended, balanced, and double balanced. The double balanced mixers are capable of isolating both the RF signal and the local oscillator LO voltages from the output and thus allow overlap of the RF and IF frequency bandwidths. Several prior art mixer circuits are well known. Double balanced and triple balanced mixers have been described in the prior art. Double balanced mixers use a diode ring and two baluns. One of the baluns separates the local oscillator and intermediate frequency signal or the RF and intermediate frequency signal. An extension of this concept is the use of two ring diodes and three separate baluns, one each for RF, LO and IF signals. This approach has the advantage of having very good isolation and low inter-modulation products but requires a 3 dB higher RF power level.

For frequencies below 5 GHz, ferrite transformers are used for the baluns. The ferrite transformers are large and require excessive circuit board space. In addition the ferrite transformers are difficult to assemble to a circuit board requiring a lengthy manual assembly process by a skilled operator. This adds undesirable cost to the product and is difficult for large scale manufacturing.

Baluns can also be implemented by transmissions lines such as a suspended microstrip or a microstrip formed on a printed circuit board. Transmission line baluns have the disadvantage that they require large amounts of space for the transmission lines to be run along the printed circuit board.

While various mixers have been used, they have suffered from being difficult to assemble, expensive to produce and requiring excessive circuit board space. A current unmet need exists for a triple balanced mixer that is compact and easily assembled.

SUMMARY OF THE INVENTION

It is a feature of the invention to provide a triple balanced mixer for mixing an RF input signal with a local oscillator signal to provide at an output an intermediate frequency signal with a small size that is easily assembled and that has good isolation and low inter-modulation products.

Another feature of the invention is to provide a triple balanced mixer that includes a planar substrate that is formed from several layers of fired low temperature co-fired ceramic. The substrate has a top layer, a bottom layer and inner layers. Several vias extend through the substrate. A local oscillator balun and an RF balun are located on the inner layers and are electrically connected to the vias. The local oscillator balun is adapted to receive a local oscillator signal and the RF balun is adapted to receive an RF signal. An intermediate frequency balun is mounted to the top layer and is electrically connected to the vias. The intermediate frequency balun is adapted to provide an intermediate frequency signal. Diode rings are mounted on the top layer. The diode rings are electrically connected to the local oscillator balun, the RF balun and the intermediate frequency balun through the vias. The diode rings mix the local oscillator signal with the RF signal to provide the intermediate frequency signal.

The invention resides not in any one of these features per se, but rather in the particular combination of all of them herein disclosed and claimed. Those skilled in the art will appreciate that the conception, upon which this disclosure is based, may readily be utilized as a basis for the designing of other structures, methods and systems for carrying out the several purposes of the present invention. Further, the abstract is neither intended to define the invention of the application, which is measured by the claims, neither is it intended to be limiting as to the scope of the invention in any way.

BRIEF DESCRIPTION OF THE DRAWINGS

In order that the invention may be more fully understood, it will now be described, by way of example, with reference to the accompanying drawings in which.

It is noted that the drawings of the invention are not to scale. In the drawings, like numbering represents like elements between the drawings.

DETAILED DESCRIPTION OF THE PREFERRED EMBODIMENT(s)

Figure 1:
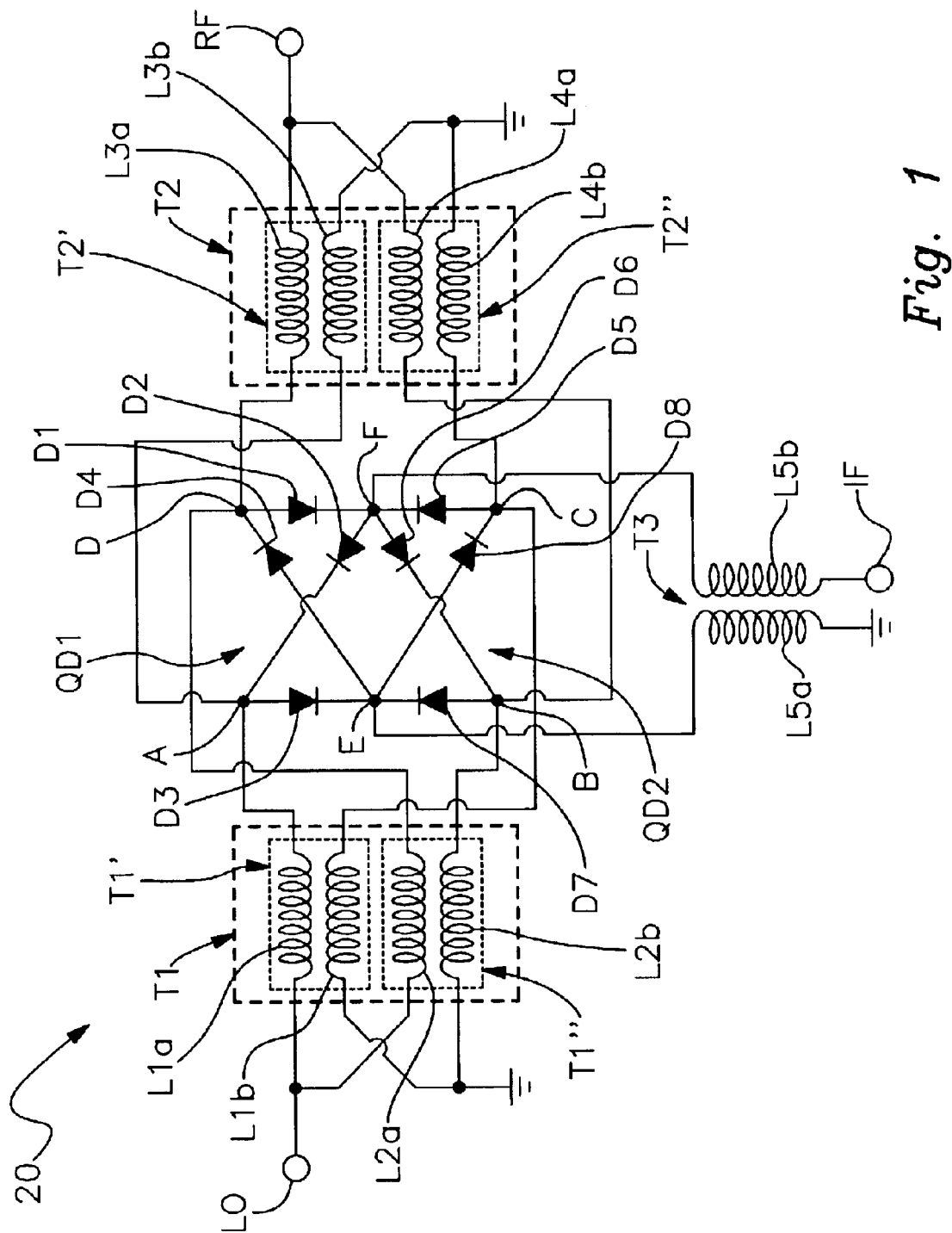
FIG. 1 is a schematic drawing of the present invention.

FIG. 1 shows a schematic drawing of the present invention. Triple balanced mixer 20 has a local oscillator input terminal LO for receiving a local oscillator signal, an RF input terminal RF for receiving an RF signal and an intermediate frequency output terminal IF for providing an intermediate frequency output signal.

A first mixer or diode ring quad QD1 has diodes D1, D2, D3 and D4. Each diode has an anode and a cathode. The cathode of diode D1 is connected to the anode of diode D2 at a port or node F. The cathode of diode D2 is connected to the anode of diode D3 at a port or node A. The cathode of diode D3 is connected to the anodes of diode D4 and D8 and the cathode of diode D7 at a port or node E. The cathode of diode D4 is connected to the anode of diode D1 at a port or node D.

A second mixer or diode ring quad QD2 has diodes D5, D6, D7 and D8. Each diode has an anode and a cathode. The cathode of diode D5 is connected to the anodes of diodes D6 and D2 and the cathode of diode D1 at a node F. The cathode of diode D6 is connected to the anode of diode D7 at a node B. The cathode of diode D7 is connected to the anode of diode D8 at a node E. The cathode of diode D8 is connected to the anode of diode D5 at a node C.

Local oscillator port LO is connected to local oscillator balun T1. Balun T1 has a pair of transformers T1' and T1". Transformer T1' has windings L1$a$ and L1$b$. Transformer T1" has windings L2$a$ and L2$b$. Windings L1$a$ and L1$b$ are electro-magnetically coupled as are windings L2$a$ and L2$b$. Winding L1$a$ has one end connected to port LO and the other end connected to node A. Winding L1$b$ has one end connected to ground and another end connected to node C. Winding L2$a$ has one end connected to node D and the other end connected to port LO. Winding L2$b$ has one end connected to node B and the other end connected to ground. Thus the local oscillator signal is connected to the mixer 20 through balun T1.

Figure 7:
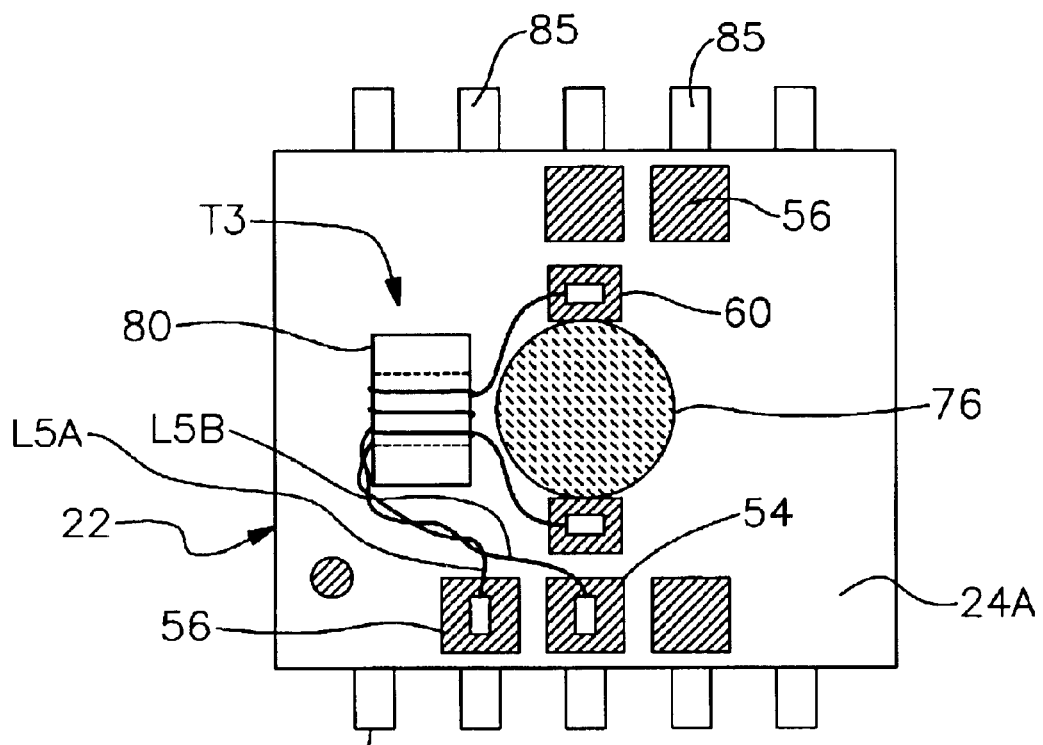
FIG. 7 is a top view of the mixer of FIG. 4 with the addition of balun transformer T3.
Figure 8:
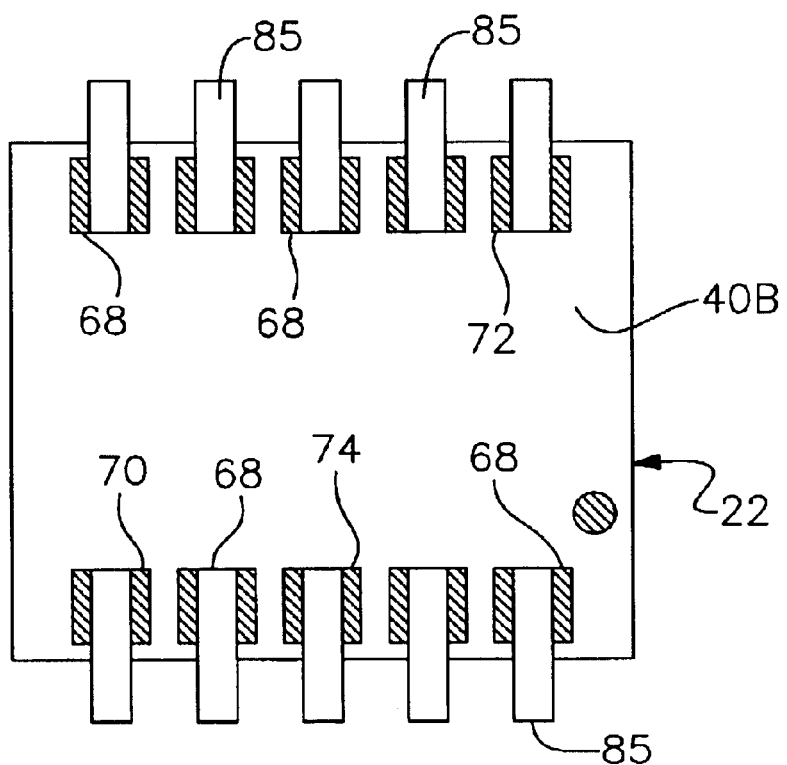
FIG. 8 is a bottom view of the mixer of FIG. 4.

Intermediate frequency output port IF is connected to intermediate frequency balun T3. Balun T3 has wire windings L5$a$ and L5$b$. Windings L5$a$ and L5$b$ are wound on a ferrite toroid core 80 (FIG. 7). Winding L5$a$ has one end connected to node E and the other end connected to ground. Winding L5$b$ has one end connected to the IF port IF and the other end connected to node F. Thus the Intermediate frequency signal IF is provided to output port IF through balun T3.

RF input port RF is connected to RF balun T2. Balun T2 has a pair of transformers T2' and T2". Balun T2 has windings L3$a$, L3$b$, L4$a$ and L4$b$. Winding L3$a$ has one end connected to port RF and the other end connected to node D. Winding L3$b$ has one end connected to ground and the other end connected to node A. Winding L4$a$ has one end connected to node B and the other end connected to port RF. Winding L4$b$ has one end connected to node C and the other end connected to ground. Thus, the RF signal is connected to mixer 20 through balun T2.

Figure 2:
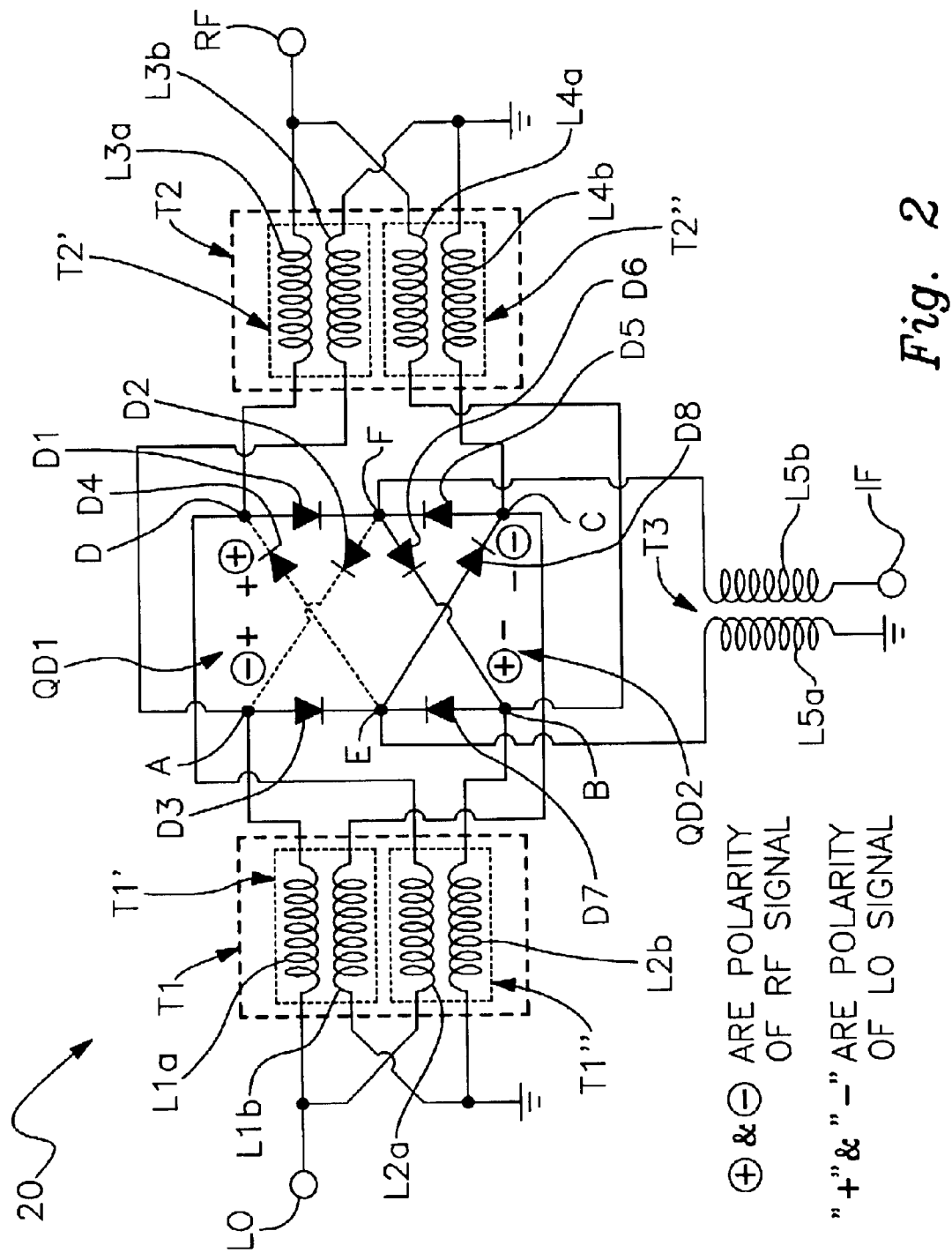
FIG. 2 is a schematic drawing illustrating the operation of the present invention when the local oscillator signal is positive.

Referring to FIG. 2, the operation of the circuit of FIG. 1 when the local oscillator signal is positive is shown. During the positive half of the LO signal, diodes, D1, D3, D6 and D8 are on. The resulting polarity of the signals is shown in FIG. 2.

Figure 3:
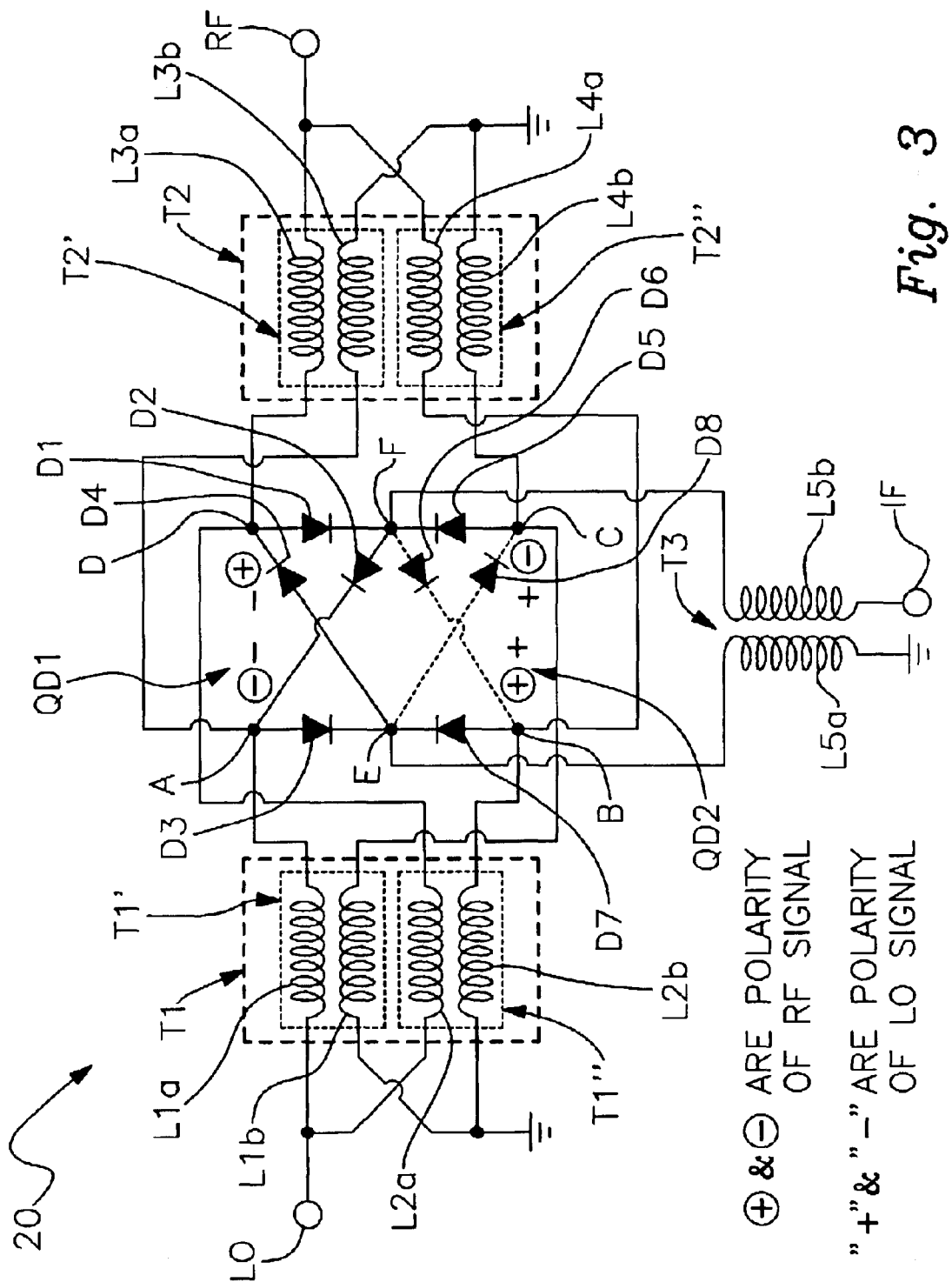
FIG. 3 is a schematic drawing illustrating the operation of the present invention when the local oscillator signal is negative.
Figure 4:
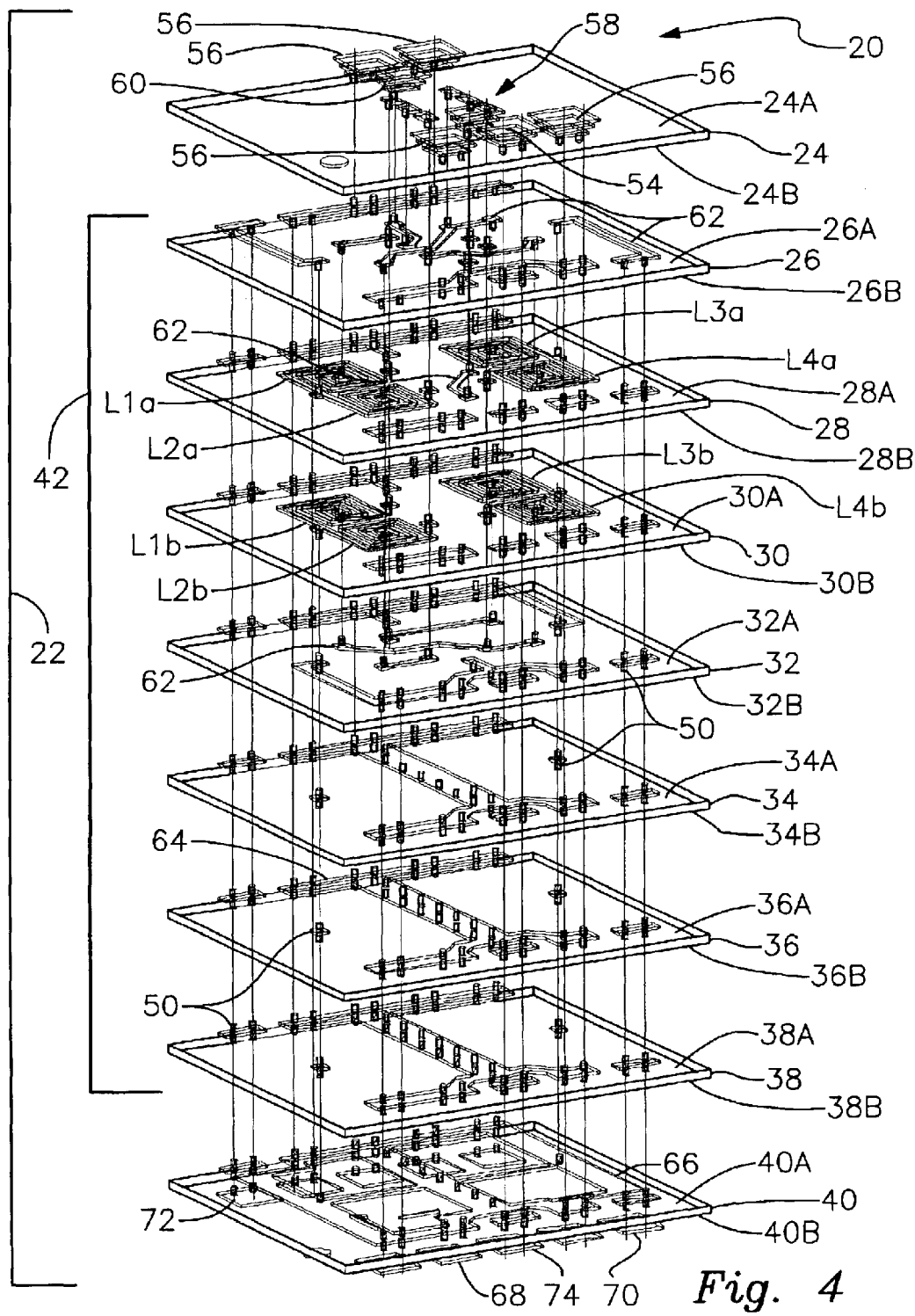
FIG. 4 is an exploded perspective view of a triple balanced mixer in accordance with the present invention.
Figure 5:
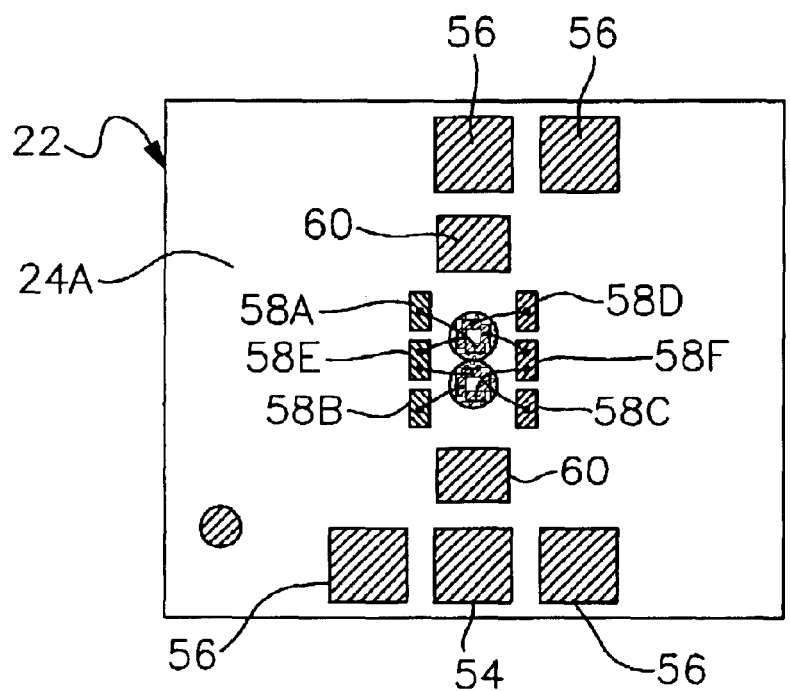
FIG. 5 is a top view of the mixer of FIG. 4.
Figure 6:
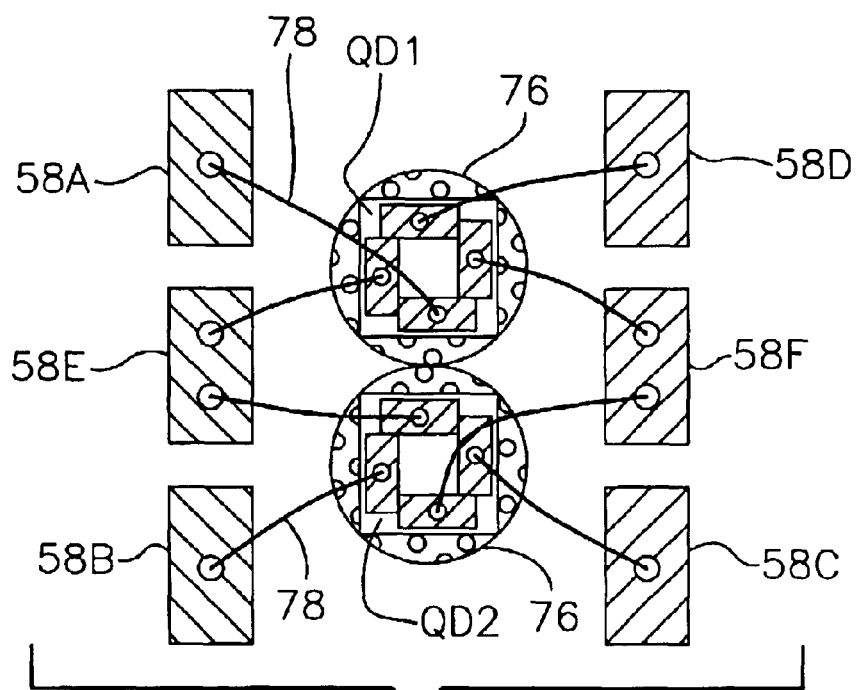
FIG. 6 is an enlarged top view of a section of the mixer of FIG. 4.

Referring to FIG. 3, the operation of the circuit of FIG. 1 when the local oscillator signal is negative is shown. During the negative half of the LO signal, diodes, D2, D4, D5 and D7 are on. The resulting polarity of the signals is shown in FIG. 3.

The polarity of the RF signal appearing at the LO port is switched at every half cycle of LO. This is equivalent to mathematical multiplication or mixing. Inter-port isolation is achieved due to the balance of the circuit. Referring to FIG. 2, node E and F are at ground potential for the LO signal. Therefore, the LO and IF ports are isolated. Similarly, the same can be seen in FIG. 3 for when the LO signal is negative. The LO signal from balun T1 that appears at transformer T2' and T2" is of the same polarity and magnitude. Therefore, the LO and RF ports are isolated from each other. The RF signal appearing at the IF port is switched every half cycle. By using fourier analysis, it can be shown that the RF signal component is not present at the IF port. This inter-port isolation eliminates or reduces the need for external filtering.

Referring now to FIGS. 4–8, the triple balanced mixer 20 shown in the schematic of FIG. 1 is realized in a physical package. Triple balanced mixer 20 has a low temperature co-fired ceramic (LTCC) structure or substrate 22. LTTC substrate 22 is comprised of multiple layers of LTCC material. There are nine LTCC layers in total. Planar layers 24, 26, 28, 30, 32, 34, 36, 38 and 40 are all stacked on top of each other and form a unitary structure 22 after firing in an oven. Layer 24 is the top layer, layer 40 is the bottom layer and layers 26, 28, 30, 32, 36 and 38 form inner layers 42. LTCC layers 24–40 are commercially available in the form of a green unfired tape from Dupont Corporation and many other suppliers. Each of the layers has a top surface 24A, 26A, 28A, 30A, 32A, 34A, 36A, 38A and 40A. Similarly, each of the layers has a bottom surface 24B, 26B, 28B, 30B, 32B, 34B, 36B, 38B and 40B. The layers have several circuit features that are patterned on the surfaces. Multiple vias 50 extend through each of the layers. Vias 50 are formed from an electrically conductive material and electrically connect one layer to another layer.

Layer 24 has several circuit features that are patterned on surface 24A. Surface 24A has IF port pad 54, ground pads 56, wire bond pads 58A–F which correspond to nodes A–F and connection pads 60. Layer 26 has several circuit lines 62 that are patterned on surface 26A. Vias 50 connect circuit lines 62 and pads 54, 56, 58 and 60 on layer 24. Layer 28 has circuit lines 62 and has four windings L1$a$, L2$a$, L3$a$ and L4$a$ patterned on surface 28A. Similarly, layer 30 has four windings L1$b$, L2$b$, L3$b$ and L4$b$ patterned on surface 30A. The windings are shaped as spiral lines on surfaces 28A and 30A. Windings L1$a$, L1$b$ and L2$a$ and L2$b$ form balun T1. Windings L3$a$, L3$b$ and L4$a$ and L4$b$ form balun T2. The a and b windings are electro-magnetically coupled through the dielectric of layer 28. The windings are connected to respective vias 50.

Layer 32 has circuit lines 62 on surface 32A that connect with vias 50. Layers 34, 36, and 38 have a ground connection 64 that is patterned on surfaces 34A, 36A and 38A. Layer 40 has a ground plane 66 patterned on surface 40A. Ground pads 68, RF port pad 70, LO port pad 72 and IF port pad 74 are patterned on surface 40B and are connected to vias 50. Vias 50 connect the ground plane 66 to ground pads 56 and 68. The ground plane 66 helps to prevent warping of the LTCC structure during fabrication and also acts as an impedance reference plane and reduces cross-talk noise.

The circuit features are formed by screening a thick film paste material and cofiring in an oven. This process is well known in the art. First, the LTCC layers have via holes punched, the vias are then filled with a conductive material. Next, the circuit features are screened onto the layers. The pads, ground connections, ground plane and circuit lines are formed with a conductive material. The layers are then aligned and stacked on top of each other to form LTCC substrate 22. The LTCC substrate 22 is then fired in an oven at approximately 850 degrees centigrade to form a unitary piece.

After firing, balun T3 and diode rings QD1 and QD2 are attached to top surface 24A by an epoxy 76. The diode rings are used in bare die (semiconductor chip) form to reduce size and cost. Wire bonds 78 are placed between connection points on the diode rings and wire bond pads 58A–F. Additional epoxy 76 is placed over the diode rings QD1 and QD2 after wire bonding to protect the diodes. Balun T3 has windings L5a and L5b wound around ferrite toroid 80. Balun T3 has four ends of its windings welded or soldered to connection pads 54 and ground pads 56. Metal leads 85 are soldered to pads 68, 70, 72 and 74 on surface 40B. Mixer 20 would be mounted to a printed circuit board by soldering lead 85 to a printed circuit board (not shown).

The electrical performance of mixer 20 is affected by the parasitic capacitance, inductance and resistance of substrate 22 and the circuit features. An electromagnetic simulator was used to model the parasitic elements and to optimize the electrical performance and minimize the effects of the parasitic elements.

The present invention has several advantages. Since, the baluns T1 and T2 are integrated into substrate 22 on layers 28 and 30, they take up less space, resulting in a smaller package that is easier to assemble and to automate production of. This provides a savings of space on the printed circuit board and allows for a faster assembly process at lower cost. In addition, repeatability of electrical performance is of prime concern. Fabricating the mixer using an LTCC process results in a more uniform electrical performance in the resulting mixer. The LTCC layers have tightly controlled tolerances that provide well defined RF characteristics. The ground plane provides for lower noise.

Figure 9:
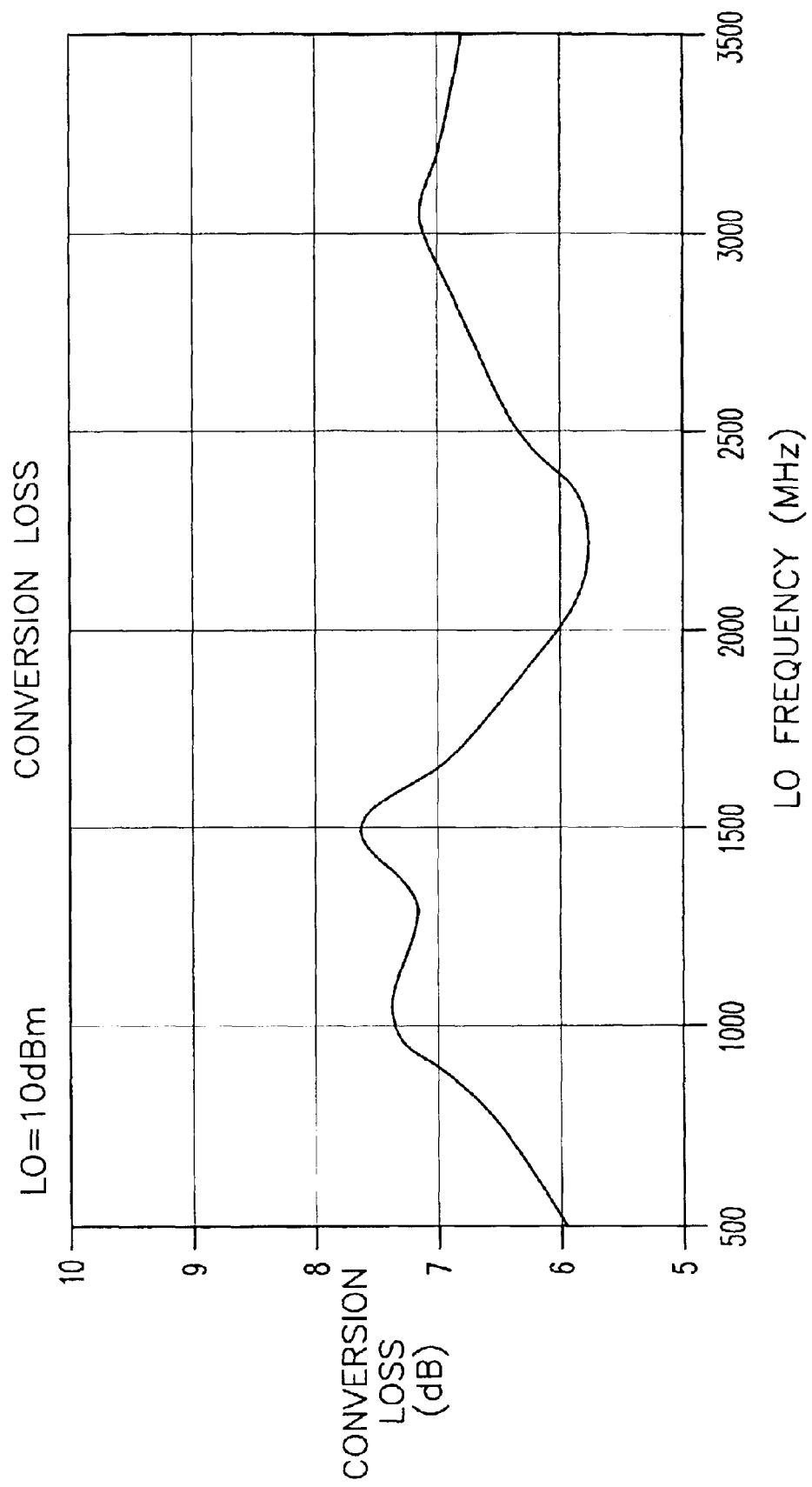
FIG. 9 is a graph of conversion loss versus LO frequency for the mixer of FIG. 1.

Referring to FIG. 9, a graph of conversion loss versus LO frequency for triple balanced mixer 20 is shown. Mixer 20 was fabricated and tested for electrical performance. The conversion loss is approximately 6.5 dB over the frequency range of 1800 to 2500 Mhz.

Figure 10:
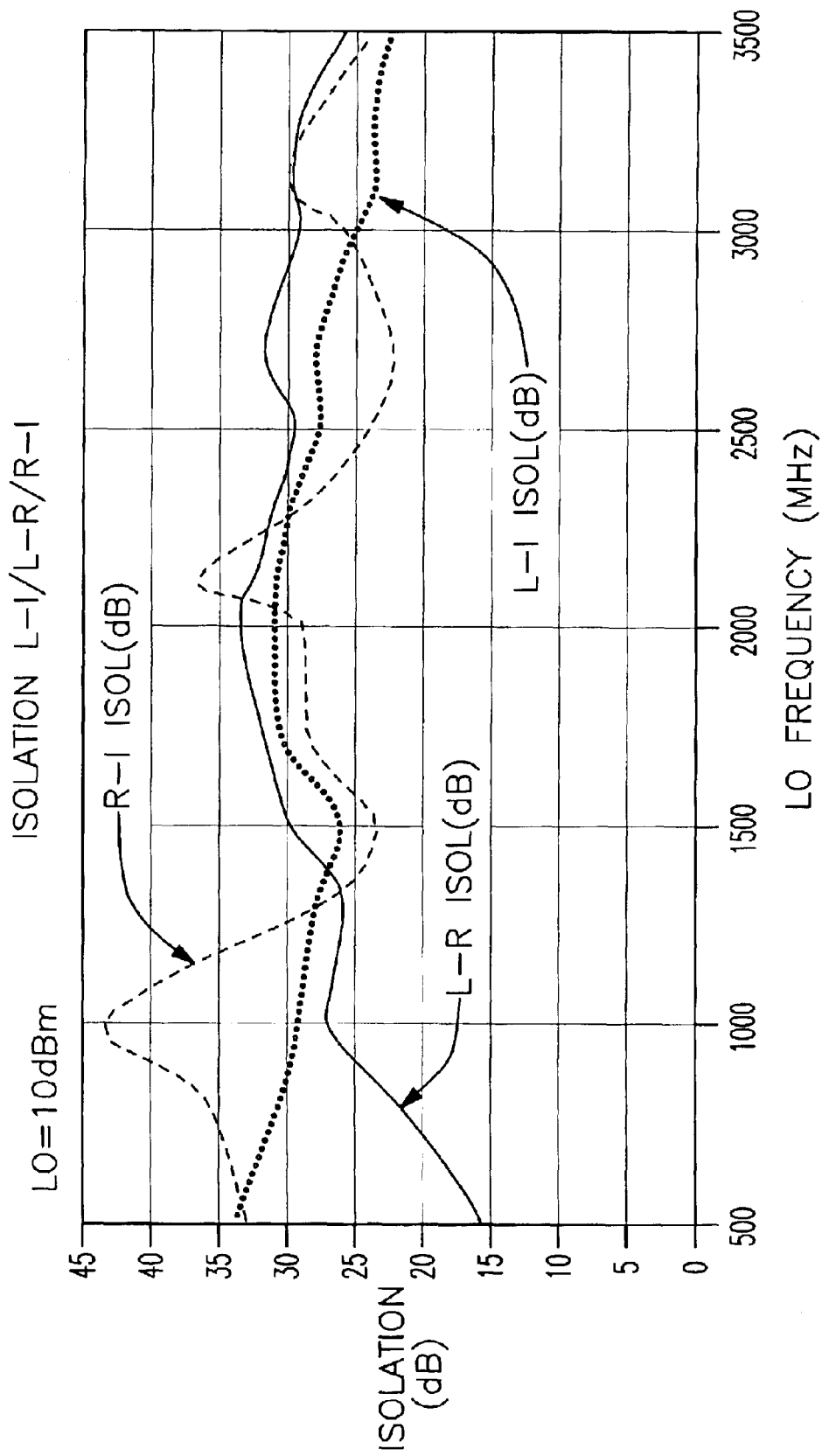
FIG. 10 is a graph of L-I, L-R and R-I isolation versus LO frequency for the mixer of FIG. 1.

FIG. 10 shows a graph of LO port to IF port (L-I), LO port to RF port (L-R) and RF port to IF port (R-I) isolation versus LO frequency for mixer 20. A measurement of approximately 30 dB was obtained for L-I, L-R and R-I isolation. Mixer 20 has a useable performance range of LO frequency from 500 to 3000 Mhz.

Several other electrical performance parameters were also tested. Impedance matching was excellent with a return loss of 12 dB at the LO port, 10 dB at the RF port and 20 dB at 500 Mhz and 10 dB at 1000 Mhz at the IF port. The third order intercept point (IP3) of this mixer is 16–18 dBm. The compression is approximately 6 dBm. The third order intercept and compression values are comparable to prior art mixers of larger size and higher complexity.

Another mixer was fabricated using the design of mixer 20. This mixer was optimized for performance in the LO frequency range of 3000 to 4500 Mhz and a useable range of 1000 to 5000 Mhz. This mixer had a useable IF bandwidth of 10 to 1300 Mhz.

The mixer of the present invention uses low barrier Schottky diodes that need 10 dBm LO power to operate. Medium, high barrier, 8 diode quads diodes etc. can also be used. With these diodes, a higher value of IP3 can be obtained at the expense of using higher local oscillator (LO) power levels.

Triple balanced mixer 20 is small in size, high in performance, needs fewer manufacturing steps and is low in cost providing an improvement over previous mixers.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the description. All changes that come within the meaning and range of equivalency of the claims are to be embraced within their scope.

What is claimed is:

1. A triple balanced mixer for mixing an RF input signal with a local oscillator signal to provide at an output an intermediate frequency signal, comprising:
    (a) a plurality of planar ceramic layers, the plurality of planar ceramic layers including a top layer, a bottom layer and inner layers;
    (b) a plurality of vias interconnecting the ceramic layers;
    (c) a plurality of circuit lines located on the ceramic layers and connected to the vias;
    (d) at least one diode ring mounted to the top layer and electrically connected to the vias;
    (e) at least one balun mounted on the inner layers and electrically connected to the vias;
    (f) a transformer mounted to the top layer and electrically connected to the vias; and
    (g) a plurality of leads mounted to the bottom layer and electrically connected to the vias.

2. The triple balanced mixer according to claim 1, wherein two diode rings are mounted to the top layer.

3. The triple balanced mixer according to claim 2, wherein a first and a second balun are mounted on the inner layers and electrically connected to the vias.

4. The triple balanced mixer according to claim 3, wherein the first and second baluns each have a first and third winding located on a first inner layer and a second and fourth winding located on a second inner layer, the windings electrically connected to the vias.

5. The triple balanced mixer according to claim 2, wherein a plurality of bond pads are located on the top surface and are electrically connected to the vias, a plurality of wire bonds electrically connect the diode rings to the bond pads.

6. The triple balanced mixer according to claim 5, wherein an epoxy covers the diode rings.

7. The triple balanced mixer according to claim 5, wherein the transformer is a third balun.

8. The triple balanced mixer according to claim 7, wherein the transformer has a plurality of wires that are welded to the bond pads.

9. A triple balanced mixer comprising:
    (a) a planar substrate having a plurality of layers including a top layer, a bottom layer and inner layers;
    (b) a plurality of vias extending through the layers;
    (c) a first and a second balun located on two of the inner layers and electrically connected to the vias;
    (d) two diode rings mounted on the top layer and electrically connected to the first and second baluns through the vias;
    (e) a third balun mounted to the top layer and electrically connected to the diode rings through the vias; and
    (f) a plurality of leads mounted to the bottom layer and electrically connected to the vias.

10. The triple balanced mixer according to claim 9, wherein the first and second baluns each have a first and third winding located on one of the inner layers and a second and fourth winding located on another inner layer.

11. The triple balanced mixer according to claim 9, wherein the third balun has a pair of windings wound around a toroid ferrite core.

12. The triple balanced mixer according to claim 9, wherein a plurality of bond pads are located on the top surface and are electrically connected to the vias.

13. The triple balanced mixer according to claim 12, wherein a plurality of wire bonds electrically connect the diode rings to the bond pads.

14. The triple balanced mixer according to claim 11, wherein the pair of windings are electrically connected to the bond pads.

15. The triple balanced mixer according to claim 11, wherein the diode rings and the third balun are attached to the top surface by an epoxy.

16. The triple balanced mixer according to claim 11, wherein each diode ring has four diodes.

17. The triple balanced mixer according to claim 11, wherein the substrate is formed from a low temperature co-fired ceramic.

18. A triple balanced mixer comprising:
 (a) Load Pull Circuit for Oscillator a planar substrate formed from a plurality of layers of fired low temperature co-fired ceramic, the substrate including a top layer, a bottom layer and inner layers;
 (b) a plurality of vias extending through the substrate;
 (c) a local oscillator balun and an RF balun located on the inner layers and electrically connected to the vias, the local oscillator balun adapted to receive a local oscillator signal, the RF balun adapted to receive an RF signal;
 (d) an intermediate frequency balun mounted to the top layer and electrically connected to the vias, the intermediate frequency balun adapted to provide an intermediate frequency signal; and
 (e) two diode rings mounted on the top layer, the diode rings electrically connected to the local oscillator balun, the RF balun and the intermediate frequency balun through the vias, the diode rings mixing the local oscillator signal with the RF signal to provide the intermediate frequency signal.

19. The triple balanced mixer according to claim 18, wherein a plurality of leads are mounted to the bottom layer and are electrically connected to the vias.

20. The triple balanced mixer according to claim 18, wherein the local oscillator balun and the RF balun each have a first and third winding located on a first inner layer and a second and fourth winding located on a second inner layer.

21. The triple balanced mixer according to claim 18, wherein a plurality of circuit lines are located on the inner layers.

22. The triple balanced mixer according to claim 20, wherein the first and third windings are magnetically coupled and the second and fourth windings are magnetically coupled.

23. The triple balanced mixer according to claim 18, wherein the plurality of layers comprise nine layers that are located adjacent each other.

* * * * *